United States Patent [19]

Ishaque et al.

[11] Patent Number: 5,438,217
[45] Date of Patent: Aug. 1, 1995

[54] PLANAR AVALANCHE PHOTODIODE ARRAY WITH SIDEWALL SEGMENT

[75] Inventors: Ahmad N. Ishaque, Albany; Donald E. Castleberry, Schenectady, both of N.Y.

[73] Assignee: General Electric Company, Schenectady, N.Y.

[21] Appl. No.: 235,052

[22] Filed: Apr. 29, 1994

[51] Int. Cl.⁶ .................. H01L 27/14; H01L 31/00
[52] U.S. Cl. .................. 257/438; 257/446; 257/464; 257/465
[58] Field of Search ............ 257/461, 438, 443, 452, 257/495, 446, 186, 466, 465

[56] References Cited

U.S. PATENT DOCUMENTS

| | | | |
|---|---|---|---|
| 3,886,579 | 5/1975 | Ohuchi et al. | 257/438 |
| 4,142,200 | 2/1979 | Mizushima et al. | 357/30 |
| 4,458,260 | 7/1984 | McIntyre et al. | 357/30 |
| 5,021,854 | 6/1991 | Huth | 357/30 |
| 5,049,962 | 9/1991 | Huang et al. | 357/30 |
| 5,343,055 | 8/1994 | Davis et al. | 257/438 X |

FOREIGN PATENT DOCUMENTS

| | | | |
|---|---|---|---|
| 5760876 | 4/1982 | Japan | 257/186 |
| 1028969 | 1/1989 | Japan | 257/438 |
| 2090575 | 3/1990 | Japan | 257/438 |
| 2253666 | 10/1990 | Japan | 257/438 |
| 3297173 | 12/1991 | Japan | 257/438 |
| 1215557 | 12/1970 | United Kingdom . | |

OTHER PUBLICATIONS

V. L. Gelezunas et al., "Uniform Large-Area High--Gain Silicon Avalanche Radiation Detectors From Transmutation Doped Silicon," American Institute of Physics, 1977, pp. 118-120.

Sze, S. M., "Physics of Semiconductor Devices," John Wiley, New York, 1981, pp. 783-787.

Primary Examiner—William Mintel
Attorney, Agent, or Firm—Donald S. Ingraham; Marvin Snyder

[57] ABSTRACT

A planar photosensitive device, such as an array of APDs, includes a planar block of n type semiconductor material having a plurality of p type wells in the block surrounded by a foundation of n type semiconductor material. Each p type well corresponds to an APD pixel and is disposed so as to respectively adjoin a first surface of the block and such that a respective p-n junction is formed between the p type material in the well and the n type material foundation. Each APD pixel further comprises depletion layer profile modification means such that the peak surface electric field of the p-n junction in each well is substantially less than the bulk electric field of the same p-n junction. One type of depletion layer profile modification means is a peripheral doped region of p material disposed around each respective well; an alternative depletion layer profile modification means is a respective isolation moat around each well so as to separate p type material in the well from n type material in the foundation except along a parallel plane segment of the p-n junction.

17 Claims, 3 Drawing Sheets

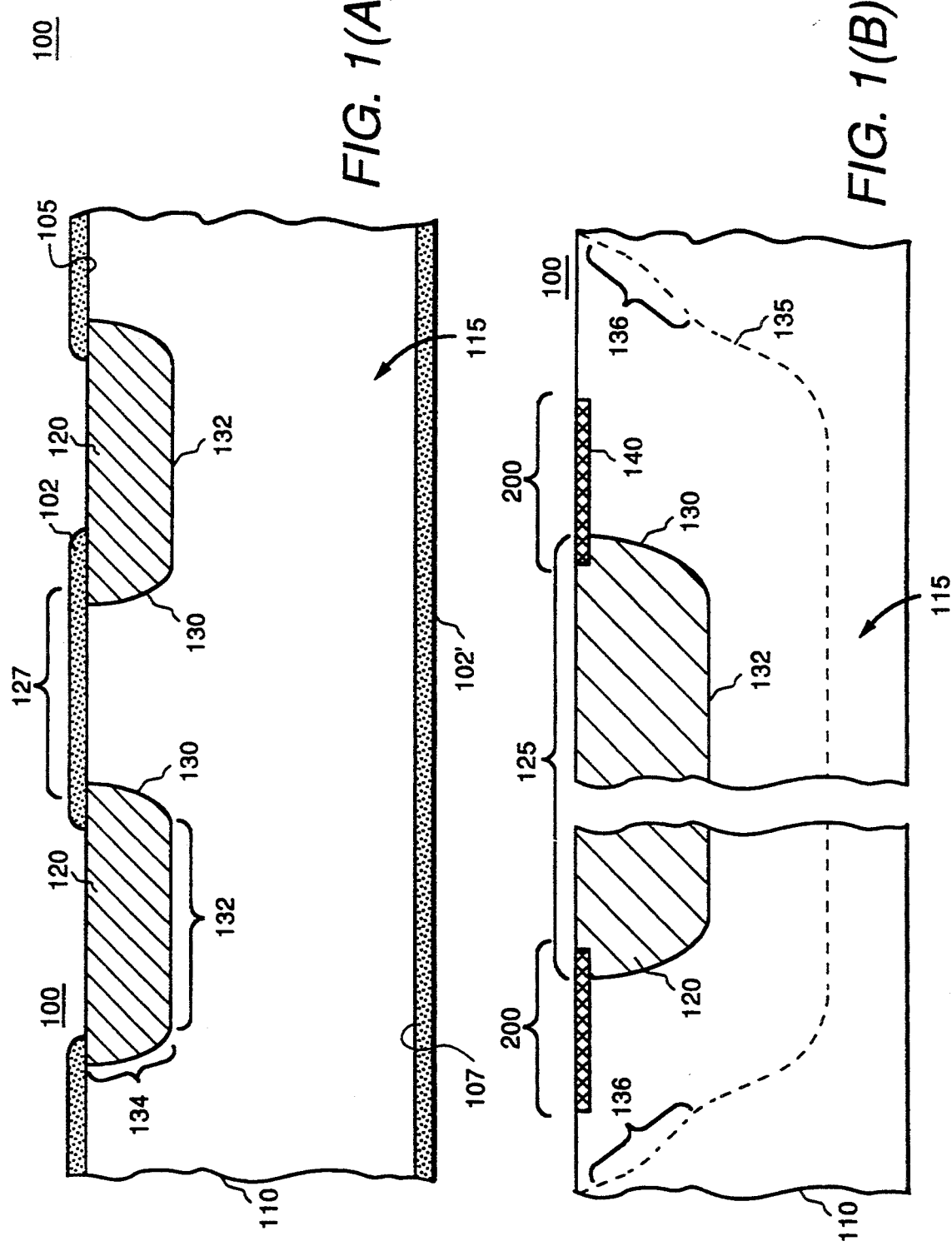

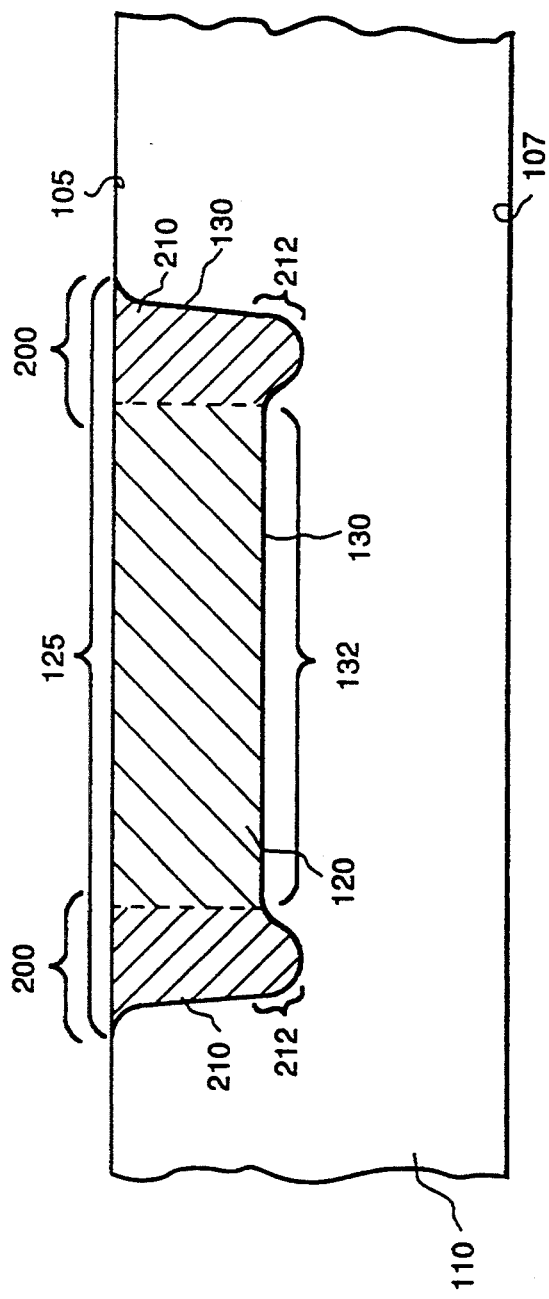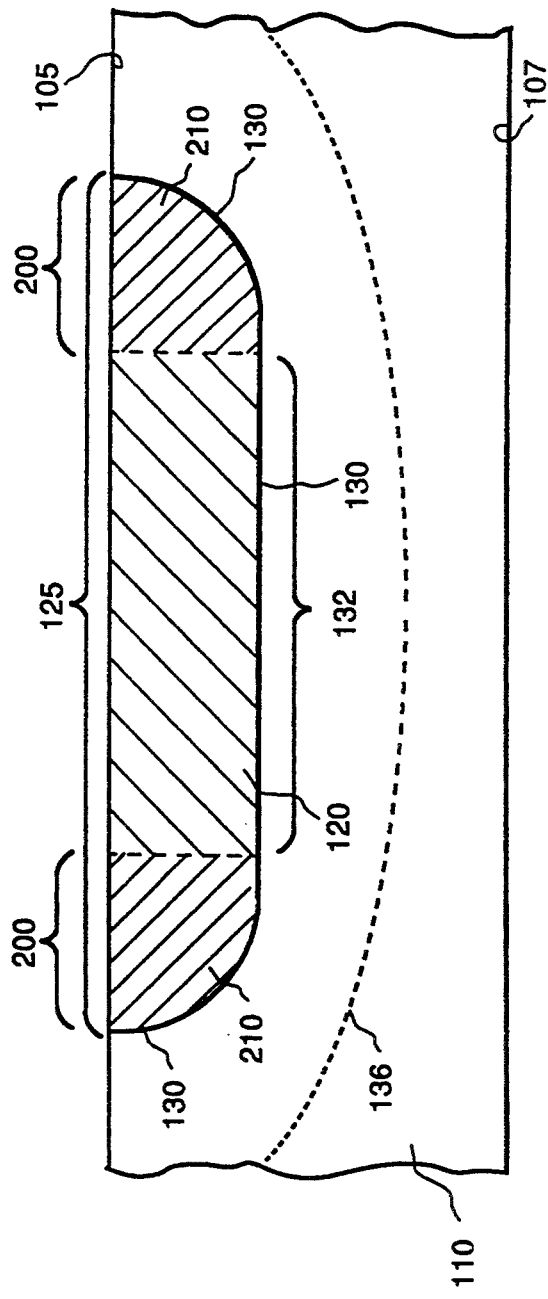

PLANAR AVALANCHE PHOTODIODE ARRAY WITH SIDEWALL SEGMENT

BACKGROUND OF THE INVENTION

This invention relates generally to avalanche photodiodes (APDs) and in particular to monolithic planar arrays of APDs and methods for forming such arrays.

Devices used in radiation imaging for medical purposes or the like must be able to detect low levels of incident optical photons or ionizing particles to minimize patient exposure to radiation. In such imaging devices it is often advantageous to employ radiation detection devices having internal gain; avalanche photodiodes (APDs) are commonly used in such devices to provide the desired detection sensitivity. An APD is a semiconductor device that is biased near the breakdown region such that charge generated as a result of the absorption of an incident photon is amplified in the APD itself as a result of a cascading effect as charge is accelerated by the high bias potential applied across the p-n junction of the device. In such imaging devices, it is desirable that the APD exhibit low noise and high gain. Certain devices, such as medical imagers (e.g., using gamma radiation), also require relatively large arrays (e.g., about 5 cm² or larger) of high quality, low noise APDs.

Currently, the two types of APD designs in common use are the "deep diffused" structure and the "reach through" structure. Deep diffused APDs exhibit a wide avalanche region and operate at a relatively small electric field, resulting in a small value of the device parameter "k" (which determines excess noise), large gain, and stable device operation.

Deep diffused APDs, however, are typically not readily manufactured in large arrays as each device must be formed to have a precise bevel at the edge of the device. The bevel is required to reduce the peak surface field (i.e., the electric field across the p-n junction in the area where the p-n junction intersects the surface of the structure) of the APD well below the peak bulk electric field (i.e., the electric field across the p-n junction in the body of the device where the p-n junction is disposed substantially parallel to the surfaces of the device to which the bias is applied) so that the APD breaks down in the bulk instead of at the surface. For example, the peak surface field should have a value about 70% or less than the value of the bulk field to ensure the APD breaks down in the bulk (breakdown outside of the bulk results in significantly more device noise).

Bevel formation requires mechanical operations which make the fabrication process non-standard in that the bevel for each device must be individually formed. The non-standard methods required for bevel formation also results in reduced yield and non-uniform reliability of the devices formed, making the fabrication of large area arrays of this type of device expensive and difficult. Furthermore, the beveled edge procedure is difficult to extend to monolithic arrays because of the lack of a suitable isolation technique between adjacent devices on a chip.

Deep diffused APDs are typically fabricated by diffusing a p type dopant, such as gallium, into a wafer of n type material from both sides of the wafer, resulting in two parallel p-n junctions in the wafer. The p doped material on one side of the wafer is completely removed so that only one p-n junction remains in the wafer. The remaining p and n regions are thinned to appropriate dimensions and p+ and n+ diffusions are made to respective sides of the wafer to form a contact pad to the p and n doped sections, respectively. Discrete devices are then diced from the wafer, and the edges are beveled as described above to obtain the desired surface field characteristics for good reverse blocking capability. The mechanical cutting and finishing (such as by etching) of the bevels renders an array of such devices mechanically fragile. As noted above, such a process is time consuming and requires a high degree of precision to form the appropriate bevels, and such a structure requires a careful passivation to minimize the injection of charge from the beveled portion of the device.

Variations of this technique, in which shallow grooves are cut that extend close to, but not into, the depletion area of the device, have also been tried. Isolation in such a device is a function of lateral inter-pixel resistance as compared to the input resistance of the readout circuit; because the depletion layer changes depending upon applied voltage, isolation in this type of device is obtained only for a very narrow range of applied bias voltage. Further, even in this narrow range of voltage, a small input resistance is needed in the readout circuit to provide adequate isolation. The Johnson noise from this resistance, because of its small value, typically introduces unacceptable noise levels in the preamplifier and is unacceptable for medical imaging devices.

The reach through APD structure generally does not require bevel formation. The reach through type of APD typically has a shallow p-n junction that results in lower gain, a larger value of k (resulting in high noise devices), and greater temperature drift than deep diffused devices. Further, the active area of reach through devices is small as compared to deep diffused devices. Array fabrication can be accomplished, although the process is time consuming and expensive as many steps are required to fabricate the array, and the resulting APDs in the array suffer the drawbacks noted above. Arrays in reach-through technology are also limited to a small active area.

For most imager devices, it is thus desirable to have an APD array that is readily fabricated and that contains high quality individual APD pixels, that is APDs that exhibit low noise and high gain. It is also desirable that the array be structurally strong.

It is an object of this invention to provide an APD array that is structurally strong, readily fabricated, and that comprises APDs that exhibit low noise and high gain.

It is a further object of this invention to provide a method of fabricating a planar APD structure comprising high quality APDs.

SUMMARY OF THE INVENTION

A monolithic planar avalanche photodiode (APD) array in which isolation is obtained on the p type material side of the array includes at least one p type semiconductor material well extending inward from a first surface of the planar array, and a foundation comprising n type semiconductor material disposed around each of the p type wells such that a p-n junction is formed between the two types of semiconductor material, with each of the wells corresponding to an APD pixel in the array. Each of the p type material wells is configured such that its respective p-n junction comprises a parallel segment disposed substantially parallel to a second surface of the planar array, the second surface being disposed substantially opposite the first surface of the array. The parallel segment is the portion of the p-n junction across which the bulk electric field of the APD pixel is determined. Each of the wells further has a well sidewall segment disposed between the parallel segment of the p-n junction and the first surface of the array; the surface electric field of each APD pixel is determined across the first surface portion of the well sidewall segment. In accordance with this invention, the planar APD array further comprises means for controlling the surface electric field disposed across respective well sidewall segments at the first surface such that the peak surface electric field of each of the wells is less than the bulk electric field of that well, such that the device electrically breaks down in the area of the bulk electric field before breaking down in the area of the surface electric field in normal operation.

The means for controlling the surface electric field of each of the wells comprise respective peripheral doped regions extending around the wells and, alternatively, a plurality of isolation moats, one of which is disposed around each respective well sidewall segment. Peripheral doped regions comprise respective p type doped regions that surround a well; the p type material in the peripheral region displaces the depletion zone profile so as to reduce the peak surface field of the device. The peripheral doped region may be formed by diffusion of p type dopant into the wafer or alternatively by ion implant techniques; the p doped peripheral regions are disposed so that the surface electric field of the APD pixel is reduced below that of the corresponding bulk electric field. In the embodiment having isolation moats, each respective isolation moat is disposed around a respective well so as to separate p type material in the well from n type material in the foundation except along the respective parallel segment of the p-n junction.

A method of forming a planar APD array includes the steps of doping a substantially planar block of n type semiconductor material with a p type dopant in accordance with a selected pattern to form a plurality of p type wells in the block surrounded by a foundation of n type semiconductor material. Each p type well is disposed so as to respectively adjoin a first surface of the block and such that a respective p-n junction is formed having a parallel segment that is disposed substantially parallel to the second surface of the planar block. The doped planar block is then processed to modify the depletion layer profile associated with each respective p-n junction such that the peak surface electric field of each of said wells at the first surface is less than the bulk electric field of said well whereby the APD pixel electrically breaks across said parallel segment of the p-n junction before breaking down in the area of said surface electric field.

The processing of the block to modify the depletion layer profile includes the steps of forming a peripheral region comprising p type semiconductor material around each of the wells at the first surface, or, alternatively, forming respective isolation moats around the respective wells.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIGS. 1(A)–1(C) are cross sectional views of a portion of a planar avalanche photodiode array at three successive steps during the fabrication process in accordance with one embodiment of this invention.

FIG. 2(A) is a cross-sectional view of a portion of an avalanche photodiode array in accordance with one embodiment of the present invention having peripheral doped regions.

FIG. 2(B) is a cross-sectional view of a portion of an avalanche photodiode array in accordance with another embodiment of the present invention having peripheral doped regions.

DETAILED DESCRIPTION OF THE INVENTION

A deep diffused semiconductor device planar array 100 (FIG. 1(A) having isolation on the p side of the army is formed in accordance with this invention as set out below. "Deep diffused," as used herein, refers to devices in which a desired dopant has been introduced into a block of semiconductor material to alter its doping profile and to establish a desired p-n junction profile at a substantial depth from the surface, such as greater than 100 $\mu$m. As used herein, "planar" refers to a device structure having two opposing surfaces that are substantially parallel to one another. "Isolation on the p side of the array", as used herein, refers to a semiconductor device comprising a surface having contacts to wells of p type material on that surface. The respective wells of p type material are separated electrically from one another at this surface by intervening areas of n type material. The method of this invention is particularly well adapted to the formation of avalanche photodiode (APD) devices; additionally, power semiconductor devices such as power rectifiers and inverters can be readily formed in accordance with this invention.

In accordance with this invention means for controlling a wafer having a p type material well formed in n type material further comprises means for controlling the surface electric field of the p type material well such that the peak electric surface field of the well is less than about 70% of the bulk electric field of the well. Such means, described in more detail below, comprise peripheral doped regions of p type material disposed around the well or, alternatively, isolation moats disposed around the well.

Figure 1C:
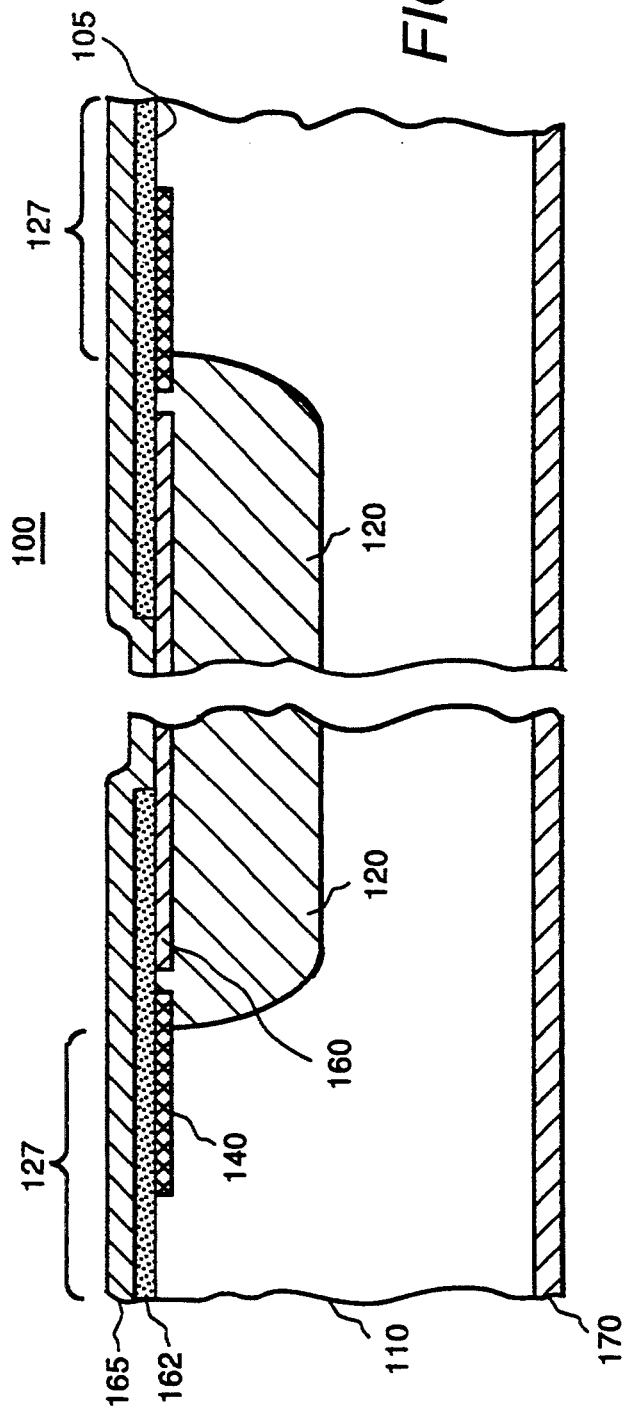

One embodiment of the present invention, namely the fabrication of a planar deep diffused avalanche photodiode (APD) array comprising peripheral doped regions, is illustrated in FIGS. 1(A)–1(C). A block of n type semiconductor material 110 comprises a first surface 105 and a second surface 107 that are disposed opposite one another and that are substantially parallel to one another. "Substantially parallel" refers to surfaces that lie in planes that are within a range of about plus or minus 2° of being parallel to one another. "N type semiconductor material" or the like refers to semiconductor material that is doped so that it exhibits n type conductivity, that is, electrons comprise the majority carrier and the holes in the material comprise the minority carrier (similarly, "p type semiconductor material" or the like refers to semiconductor material in which holes comprise the majority carrier and electrons comprise the minority carrier). In accordance with this invention, the n type semiconductor material comprising block 100 has a constant concentration of n type dopant throughout the block, that is, the block is uniformly doped. Block 110 typically comprises neutron transmutation doped silicon; the neutron transmutation doping process provides a substantially uniform n type doping level throughout block 110. The thickness of block 110 (that is, the distance between first and second surfaces 105, 107) is typically in the range between about 400 $\mu$m and 1500 $\mu$m.

In accordance with the method of this invention, block 100 is doped in accordance with a selected deep doping pattern with a p type dopant such as gallium (Ga), aluminum (Al), or the like, so as to form a plurality of deep diffused p type wells 120 in block 100. For example, a mask 102 is typically disposed on first surface 105 of block 110; mask 102 has a pattern corresponding with the selected deep doping pattern such that first surface 105 is exposed along portions where it is desired that the p type dopant enter into block 110 to form wells 120. The deep doping pattern is substantially in the shape of an orthogonal grid, with the size of the the exposed areas to form the p type material wells corresponding to the size of the individual APD pixels in the finished device. A secondary mask 102' is disposed on second surface 107 of block 110 to substantially prevent doping of block 110 from the second surface; alternatively, second surface 107 is left unmasked, and later in the fabrication process, the portion of block 110 that received p type dopant through second surface is removed from block 110 so as to leave n type material on second surface 107. Masks 102, 102' each typically comprise silicon nitride or a like material that is substantially impervious to the passage of the p type dopant used in the fabrication process.

Block 110 is typically doped with Ga in a deep diffusion process in which the block (commonly multiple blocks are processed at one time) is sealed in a chamber with a gallium source and exposed to temperatures in the range of about 1200° C. to 1270° C. under conditions known in the semiconductor processing art to drive the Ga dopant into the n type material of block 110. "Deep diffusion," as used herein, refers to diffusion of the dopant to a depth greater than about 100 $\mu$m from the surface through which the dopant is diffused. The depth of the Ga penetration across the exposed portions of first surface 105 of block 110 is controlled primarily through the duration of the deep diffusion process. Following the diffusion of the p type dopant into block 110 to form wells 120, masks 102 and 102' are removed from the respective surfaces of block 110.

In accordance with this invention, array 100 is fabricated in accordance with a depletion layer profile modification technique so as to modify the depletion layer profile associated with each well's respective p-n junction such that the peak surface field of each of said wells at first surface 105 is substantially less (e.g., $\leq$70%) than the bulk electric field of that well. For example, one depletion layer modification technique comprises forming peripheral doped areas 200 that are disposed adjacent to each well 120.

In one embodiment, each peripheral doped area 200 comprises a respective shallow doped region 140 around each well 120 at first surface 105. Each shallow doped region 140 comprises semiconductor material doped to exhibit p type conductivity; the p type dopant is driven into block 110 to a selected depth over a selected area as illustrated in FIG. 1(B) so as to effect the desired change in a depletion profile 135 to produce the desired electric fields across the p-n junction. In particular, each shallow doped region 140 typically has a depth in the range between about 1 $\mu$m and 10 $\mu$m, and has a width (as measured perpendicular to the p-n junction at first surface 105) in the range between about 25 $\mu$m and 500 $\mu$m. Further, shallow doped region 140 overlaps p-n junction 130 at first surface 105 such that about 10% of the shallow doped region is disposed over the p side of the well and the remainder is disposed over the adjoining n type material of foundation 115. The depletion layer edge 135 intersects first surface beyond the outermost extent of each respective shallow doped region 140.

The p type dopant applied to form shallow doped region 140 typically comprises gallium, boron, or the like, and typically is applied in a process in which the dopant is implanted over the selected area and then driven in via a diffusion process. Alternatively, peripheral doped regions 200 are formed by applying a mask (not shown) having a pattern corresponding to the desired peripheral doped regions to first surface 105 and then diffusing the p type dopant into the exposed areas of first surface 105; upon completion of the diffusion to form peripheral doped regions the mask is removed.

Typically the next step in the fabrication of an APD array in accordance with this invention comprises forming respective contacts to the p type wells and the underlying n type material so that in the finished device each APD pixel can be electrically addressed by readout electronics (not shown). For example, an n+ contact layer 170 is formed on second surface 107; n+ contact layer 170 typically has a thickness in the range between about 5 $\mu$m and 10 $\mu$m.

Block 110 is thinned by the removal of planar portions of the block from first surface 105 so that the distance between the remaining first surface (after removal of the planar sections) and parallel segment 132 of p-n junction 130 is in the range between 20 $\mu$m and 80 $\mu$m. A p+ layer 160 is then disposed in electrical contact with the first surface portion of each p type well so as to cover between about 80% to 97% of the surface area of each well. The p+ layer enhances the short wavelength quantum efficiency and also serves as a contact layer. An insulating layer 162, comprising silicon nitride or the like, is disposed over first surface 105 of block 110, with via openings therein disposed over wells 120. An electrical contact line 165 is then disposed over insulating layer 162 and is disposed in electrical contact with wells p+ layer 160 through via openings in insulating layer 162 so as to provide electrical contact to each well 130; for APD devices, in which incident light enters the device through the p side, contact line 165 must be substantially optically transparent. Electrically conductive and optically transmissive materials such as indium tin oxide are thus typically used to form well contact line 165. Further, the contact to each well is electrically isolated from other contact lines 165 (not shown) by intervening layers of an optically transparent insulator film such as silicon nitride.

Wells 120 are thus disposed in a foundation 115 that comprises the portion of block 110 that still exhibits n type conductivity. Each well 120 and the corresponding portion of foundation 115 disposed between the well and second surface 107 comprise an APD pixel 125 (FIG. 1(B)); the plurality of APD pixels 125 disposed in a pattern in block 110 comprise the APD array 100 in the completed device. The respective boundaries of each well 120 formed in the diffusion process represents a p-n junction 130 formed between n type material foundation 115 and p type material well 120. Each p-n junction 130 comprises a parallel segment 132 that is disposed substantially parallel to second surface 107, and an oblique segment 134 that is disposed between parallel segment 132 and first surface 105. The bulk electric field of each pixel 125 is determined across the respective parallel segment 132 of the respective p-n junction 130; the peripheral electric field across the junction is determined by the electric field across respective arcuate-shaped oblique segments 134, and the surface electric field is determined at the surface 105 along shallow doped region 140.

The outline of the respective depletion layer 135 in n type material foundation 115 is illustrated in FIG. 1(B). In accordance with this invention, each well's respective peripheral doped region 200 results in depletion layer 135 having a displaced region 136 near first surface 105; as a consequence of the lower doping of shallow doped region 140, the respective surface field of p-n junction 130 is less than the bulk electric field across the respective parallel segment (typically the peak surface field is in range such that the peak surface field in a pixel is not greater than about 70% of the bulk electric field of that pixel). Although in this device structure the peripheral electric field remains greater than the bulk electric field, the displaced region 136 also serves to reduce the peripheral electrical field so that the device can be operated at bias voltages up to about 95% of the parallel plane breakdown voltage (as compared, for example, with an APD formed as described above except without the peripheral doped regions, in which case the device can be operated only up to about 50% of the parallel plane breakdown voltage before breakdown occurs at the surface or in the peripheral region).

The value of the peak electric surface field is a function of the size and position of peripheral doped region 200. In particular, shallow doped region 140 is disposed to overlap p-n junction 130 at first surface 105. The proportion of the total area of each respective shallow doped region 140 that is disposed on the p side of p-n junction 130 at first surface is in the range between 5% and 20%. Further, the amount of charge to be implanted, $Q_I$, is determined by multiplying the peak bulk electric field at breakdown, $E_p$, with the dielectric constant of silicon, $\epsilon$, to get a product $Q_o$. $Q_I$ is then chosen in the range between 50% and 90% of $Q_o$. The smaller the value of $Q_I$, the smaller the surface field becomes, but the reduction in the peripheral field also becomes smaller. Therefore, with the use of good surface passivation, a value of $Q_I$ is chosen which is between 70% and 90% of $Q_o$; if surface passivation is of poor quality, the value of $Q_I$ is selected to be in the range of 50%-70% of $Q_o$.

For example, in a finished device as illustrated in FIG. 1(C), block 110 comprises neutron transmutation doped silicon having a resistivity of 30 ohms-cm and a thickness of about 550 μm; a Ga diffusion results in p type material wells having a thickness of about 100 μm and an n type material foundation disposed between the parallel segment of the well p-n junction and second surface 107 of about 300 μm. Another element of array 100 (FIG. 1(A)) performance relates to the size of a dead space area 127 comprising the portion of array 100 between adjacent pixels 125. It is desirable in devices used in medical imagers to minimize deadspace area 127 between pixels 125 so that the distance between respective parallel segments of p-n junctions in adjacent wells is in the range between about 50 μm and 500 μm.

In accordance with further embodiments of this invention, APD pixel 125 (FIGS. 2(A) and 2(B)) is formed with a depletion layer profile modification technique in which a deep peripheral doped region 210 is disposed around each well 120. Deep peripheral doped region 210 adjoins well 120 at parallel segment 132 and extends towards first surface 105; for purposes of describing APD pixel 125, well 120 comprises that portion of block 110 that is disposed between parallel segment 132 of p-n junction 130 and first surface 105. Deep peripheral doped region 210 comprises a region that is typically more lightly doped at a given depth from first surface 105 than well 120 at the same depth (for reasons as set out below in the discussion of the method of the present invention for forming deep peripheral doped regions 210). The presence of deep peripheral doped region 210 serves to alter the depletion layer profile so as to reduce the peak surface electric field and also reduce the peripheral electric field whereby an APD pixel 125 having peripheral doped regions can be operated at bias voltages approaching 100% of the parallel plane breakdown voltage.

As illustrated in FIG. 2(A), in one embodiment of the present invention deep peripheral doped region 210 comprises a deep-diffused protrusion 212 that extends to a depth in block 110 deeper than the depth of p-n junction parallel segment 132. This arrangement of deep peripheral doped region 210 provides desirable electrical characteristics for pixel 125, enabling the device to be operated up to its parallel plane breakdown voltage. This desirable operating characteristic is possible due to protrusion 212 being more deeply diffused than p-n junction parallel segment 132; the electric field across the more deeply diffused portion of p-n junction 130 is less than across less deeply diffused portions of p-n junction parallel segment 132. Further, the curvature of the p-n junction between parallel segment 132 and deep-diffused protrusion 212 is centered towards the lightly doped side (n side) and has a smaller peak electric field than the rest of the junction; this arrangement presents a p-n junction profile in which electrical breakdown will occur first across the parallel plane junction provided the deep protrusion extends a sufficient distance below parallel segment 132 to effect the desired depletion layer profile modification (e.g., the deep protrusion extends 180 μm deep for a 120 μm deep parallel plane junction in 30 ohm-cm semiconductor material).

In accordance with this invention, APD pixel 125 having peripheral doped region 210 with deep-diffused protrusion 212 is fabricated in accordance with the method similar to that described above with respect to the device illustrated in FIGS. 1(A)-1(B) with the exceptions as noted below. In one embodiment, peripheral doped region is formed by forming an ion implant region (not shown) comprising a first p type dopant on in the area first surface 105 corresponding to the desired position of the peripheral doped region 210 in the fabricated device. Well 120 is then formed, e.g., as discussed above, in a diffusion process using a second p type dopant. Second p type dopant has coefficient of diffusion less than the coefficient of diffusion of first p type dopant so that during the diffusion process for forming well 120 the first p type dopant is also driven into block 110; due to the difference in respective coefficients of diffusion, first p type dopant penetrates into block 110 further than the second p type dopant and thus produces peripheral doped area 212 having protrusion 212.

For example, first p type dopant comprises aluminum and the second p type dopant comprises gallium (e.g., diffusion coefficients of Al and Ga are $3 \times 10^{-12}$ and $5 \times 10^{-11}$ cm$^2$/sec. at 1250° C., respectively. The larger diffusion coefficient of the implanted dopant results in it diffusing more rapidly into the block than the second dopant, and thus the desired profile of the p-n junction is obtained. In APD pixel 125 illustrated in FIG. 2(A), the depth of well 120 (that is, the distance between first surface 105 and parallel segment 132) is about 120 μm; the depth of the deepest portion of protrusion 212 is about 160 μm; and the width (that is, the lateral extent from the edge of p-n junction 130 to well 120) of peripheral doped region at surface 105 is in the range between about 125 μm and 200 μm.

In a further alternative method of forming an APD pixel 125 with peripheral doped region 210 comprising deep diffused protrusion 212, an initial doping, preferably with a Gaussian profile, results in formation of peripheral region 210 before well 120 is formed. This initial doping typically comprises limited source diffusion through a first mask (not shown) on first surface 105. First mask is then removed and a second mask (not shown) is deposited to provide for the formation of well 120 as described above.

In a still further embodiment of the present invention, APD pixel 125 appears as illustrated in FIG. 2(B). In this embodiment, the portion of the p-n junction 130 around deep peripheral doped region 210 does not extend deeper into block 110 than parallel segment 132. The presence of deep peripheral region 210, however, reduces the surface electric filed in the lighter doped region and also results in the profile of depletion layer 136 being displaced to an extent to reduce the peripheral electric field to allow APD pixel 125 to be operated up to about 97% of its parallel plane breakdown voltage; as a result of peripheral doped region 210 being more deeply diffused than the surface (or shallow) peripheral doped regions (e,g, ion implant) regions illustrated in FIG. 1(C), the depletion layer profile is flattened further with a consequent reduction in the peripheral electric field. The width (lateral extent at first surface 105) of peripheral doped region 210 illustrated in FIG. 2(B) is in the range between about 50 μm and 200 μm.

In accordance with this invention, APD pixel 125 having peripheral doped region 210 as illustrated in FIG. 2(B) is fabricated in accordance with the method similar to that described above with respect to the device illustrated in FIGS. 1(A)–1(B) with the exceptions as noted below. Referring to FIGS. 1(A) and 1(B), in this embodiment peripheral doped regions 200 are formed prior to the formation of wells 120; mask 102 is disposed as shown in FIG. 1(A) except that it covers the respective ion implant regions. Wells 120 are then formed as noted by diffusing p type dopant into block 110; the diffusion process also causes the ions implanted in regions 140 to be driven into block 110 so as to form peripheral doped region 210 (FIG. 2(B)). As surface 105 in the area of the ion implant region is substantially covered by the mask used for forming wells 120, the peripheral doped region 210 is more lightly doped than the corresponding depths of well 120.

Figure 3:
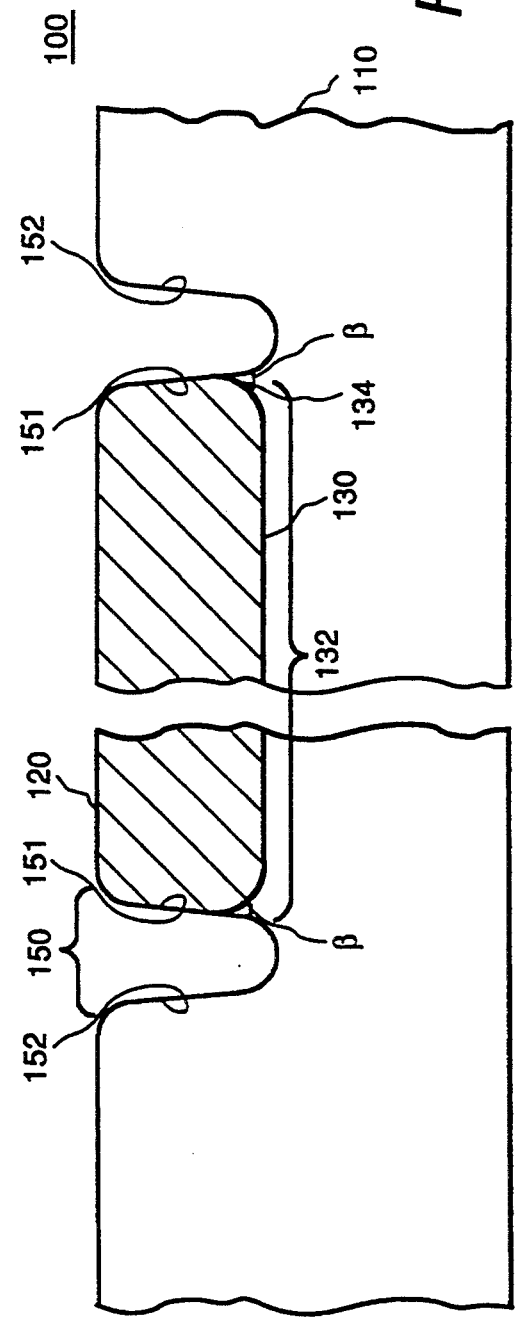
FIG. 3 is a cross sectional view of a portion of an avalanche photodiode array in accordance with another embodiment of this invention.

In accordance with another embodiment of this invention, an alternative depletion layer profile modification technique is used to process block 110 to modify the depletion layer profile associated with each well's respective p-n junction such that the peak surface field of each of said wells at first surface 105 is less than about 70% of the bulk electric field of that well. APD array 100 is fabricated as described above to the point of forming the plurality of p-type material wells 120 in block 110. The alternative depletion layer profile modification technique comprises the step of forming a respective isolation moat 150 (FIG. 3) around each well 120; each isolation moat 150 is disposed so as to form a local positive bevel at the intersection of the remaining oblique segment 134 and the surface of isolation moat 150. The term "local positive bevel" means that the angle β at the intersection of p-n junction 130 and isolation moat 150, as measured from the lightly doped side (that is, the n type material side), is acute, and preferably less than about 60°. As a consequence of the local positive bevel, the surface electric field is reduced and the device is prevented from breaking down at the surface when the device is operated up to its breakdown potential.

Isolation moats are typically formed by etching block 110 with a suitable etchant, such as acid etchants; alternatively, mechanical cutting can be used to form isolation moats 140; a yet further alternative is a combination of mechanical cutting and etching processes to form isolation moats 140. Following formation of respective isolation moats 140 for each well, APD array 100 is completed through the formation of contact layers (not shown in FIG. 2) as described above.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A deep diffused monolithic planar avalanche photodiode (APD) array for detecting incident light photons in which isolation is obtained on a p type material surface of the array, said array comprising:

a silicon block having a first surface and a second surface, said second surface being disposed opposite to said first surface;

said silicon block comprising at least one p type material well extending inward from said first surface, each of said at least one wells comprising diffused p type doped silicon having a doping gradient corresponding to diffusion of the well p type dopant from said first surface; said silicon block further comprising an n type material foundation comprising silicon having a uniform n type doping concentration, the n type doped silicon being disposed around each of said p type wells so as to form respective well p-n junctions therebetween, said n type material foundation comprising said second surface of said block and portions of said first surface extending around respective ones of said wells, each of said wells and respective foundation material comprising respective APD pixels in said APD array;

each of said respective well p-n junctions comprising a parallel segment disposed substantially parallel to said second surface of said APD array and at a depth of between 20 μm and 80 μm from said first surface; each of said well p-n junctions further comprising a well sidewall segment disposed between said parallel segment of said well p-n junction and said first surface, the respective bulk electric field of each APD pixel being disposed across the respective parallel segment of said well p-n junction, and the respective surface electric field of each APD pixel being disposed across said well p-n junction at said first surface, and the respective peripheral electric field being disposed across said well sidewall segment; and means for controlling said surface electric field and peripheral electric field such that the peak surface electric field of each of respective well is less than about 70% of the bulk electric field of said well.

2. The APD array of claim 1 wherein said foundation further comprises portions of said first surface disposed between respective first surface portions of said wells so as to electrically isolate respective wells from one another along said first surface, said foundation further comprising said second surface of said planar APD array.

3. The APD array of claim 2 wherein said means for controlling said surface electric field and peripheral electric field comprises respective peripheral doped regions disposed around each of said wells, said peripheral doped regions comprising semiconductor material having a p type dopant concentration less than the p type material comprising said well and being disposed across the respective p-n junction between respective wells and said foundation at said first surface of said array.

4. The APD array of claim 3 wherein said peripheral doped regions each comprise a shallow peripheral doped region having a depth in the range between 1 μm and 10 μm and a width in the range between about 25 μm and 500 μm.

5. The APD array of claim 4 wherein each of said shallow peripheral doped regions comprises an ion implant region disposed such that the portion of the area of said ion implant region disposed over its respective well is between about 5% and 20% of the total surface areas of said ion implant region.

6. The APD array of claim 3 wherein said means for controlling said surface electric field comprises a respective deep peripheral doped region disposed so as to adjoin said parallel segment and said sidewall segments of each well.

7. The APD array of claim 6 wherein said respective deep peripheral doped regions each comprises a deep-diffused protrusion, said protrusion being disposed in said foundation farther from said first surface than the parallel segment of said respective well.

8. The APD array of claim 7 wherein the p type dopant in said deep peripheral doped region comprises the same p type dopant in said well.

9. The APD array of claim 7 wherein the p type dopant in said deep peripheral doped region comprises a different p type dopant than the p type dopant in said well.

10. The APD array of claim 1 wherein said means for controlling said surface electric field comprises a plurality of isolation moats disposed around each respective well sidewall segments such that said p-n junction intersects said moat, said intersection comprising a local positive bevel angle measured on the foundation side of said intersection, said bevel angle being acute.

11. The APD array of claim 10 wherein said local positive bevel angle is less than about 60°.

12. The APD array of claim 10 wherein the width of each of said isolation moats at said first surface is in the range between about 50 μm and 500 μm.

13. The APD array of claim 12 wherein each of said isolation moats has a substantially V-shaped cross-sectional sidewall profile terminating in said foundation in a curved bottom portion.

14. The APD array of claim 1 the lateral distance between respective parallel segments of adjacent APD pixels in said array is in the range between 50 μm and 500 μm.

15. The APD array of claim 1 further comprising a substantially optically transparent contact layer disposed across the first surface of each of said wells.

16. The APD array of claim 15 disposed such that incident light enters said APD through said first surface.

17. The APD array of claim 1 wherein said p type silicon comprises a p type dopant selected from the group consisting of gallium, boron, and aluminum.

* * * * *